(12) United States Patent
Veto et al.

(10) Patent No.: US 10,976,119 B2
(45) Date of Patent: Apr. 13, 2021

(54) HEAT TRANSFER DEVICES AND METHODS OF TRANSFERING HEAT

(71) Applicant: The Boeing Company, Chicago, IL (US)

(72) Inventors: Christopher C. Veto, Hawthorne, CA (US); Ernest E. Bunch, Huntington Beach, CA (US); Robert Stephen Kowell, Murrieta, CA (US)

(73) Assignee: The Boeing Company, Chicago, IL (US)

( * ) Notice: Subject to any disclaimer, the term of this patent is extended or adjusted under 35 U.S.C. 154(b) by 179 days.

(21) Appl. No.: 16/048,625

(22) Filed: Jul. 30, 2018

(65) Prior Publication Data

US 2020/0033075 A1 Jan. 30, 2020

(51) Int. Cl.
*F28F 13/12* (2006.01)
*F28F 5/00* (2006.01)
*H01L 23/46* (2006.01)
*H01L 23/433* (2006.01)

(52) U.S. Cl.
CPC ............. *F28F 13/12* (2013.01); *F28F 5/00* (2013.01); *F28F 2255/04* (2013.01); *H01L 23/4332* (2013.01); *H01L 23/46* (2013.01)

(58) Field of Classification Search
CPC .......... F28F 13/12; F28F 2255/04; F28F 5/00; H01L 23/46; H01L 23/4332
USPC ....... 257/714, E23.1; 361/689; 165/80.4, 81, 165/96
See application file for complete search history.

(56) References Cited

U.S. PATENT DOCUMENTS

| 4,688,147 A | * | 8/1987 | Ono ................... H01L 23/4332 200/289 |
| 4,712,158 A | * | 12/1987 | Kikuchi ............. H01L 23/4735 361/699 |
| 4,729,060 A | * | 3/1988 | Yamamoto .......... H01L 23/4332 361/700 |

(Continued)

FOREIGN PATENT DOCUMENTS

KR 20020091044 12/2002

OTHER PUBLICATIONS

Intellectual Property India, Examination Report for related Indian Patent Application No. 201914025831, dated Sep. 4, 2020.

(Continued)

*Primary Examiner* — Paul Alvare
(74) *Attorney, Agent, or Firm* — Dascenzo Gates Intellectual Property Law, P.C.

(57) ABSTRACT

Heat transfer devices, electronic devices, and methods for heat transfer with an external body. Heat transfer devices include a first disc, a second disc positioned adjacent to the first disc, and at least one spacer positioned between the first disc and the second disc. The first disc defines an aperture and comprises a pin cooling structure extending from around the aperture. The pin cooling structure comprises a distal end configured to facilitate heat exchange between the pin cooling structure and an external/adjacent/separate body and one or more side walls. At least one of the one or more side walls, the distal end, and the aperture at least partially define a pin volume. The second disc defines an inlet that is configured to (i) receive a fluid, and (ii) allow the fluid to flow from the inlet and into the pin volume.

20 Claims, 9 Drawing Sheets

(56) References Cited

U.S. PATENT DOCUMENTS

| | | | |
|---|---|---|---|
| 4,750,086 A | | 6/1988 | Mittal |
| 4,910,642 A * | | 3/1990 | Downing ............ H01L 23/4332 |
| | | | 165/908 |
| 4,996,589 A * | | 2/1991 | Kajiwara ............ H01L 23/4332 |
| | | | 257/714 |
| 4,998,181 A | | 3/1991 | Haws et al. |
| 5,023,695 A * | | 6/1991 | Umezawa ............ H01L 23/4735 |
| | | | 257/714 |
| 5,126,919 A * | | 6/1992 | Yamamoto ................ G11B 5/64 |
| | | | 165/80.3 |
| 5,239,443 A * | | 8/1993 | Fahey ................. H01L 23/4735 |
| | | | 165/80.4 |
| 5,349,831 A * | | 9/1994 | Daikoku ............... H01L 23/427 |
| | | | 165/80.4 |
| 5,365,400 A * | | 11/1994 | Ashiwake ............. H01L 23/433 |
| | | | 165/80.4 |
| 5,390,076 A * | | 2/1995 | Umezawa ........... H01L 23/4336 |
| | | | 165/80.4 |
| 7,316,263 B2 * | | 1/2008 | Lofland ..................... F28F 3/12 |
| | | | 165/170 |
| 7,817,422 B2 * | | 10/2010 | Gunturi ................. H01L 23/473 |
| | | | 361/699 |
| 2002/0186538 A1 * | | 12/2002 | Kase ..................... H01L 23/473 |
| | | | 361/718 |
| 2009/0200007 A1 * | | 8/2009 | Foy ....................... H01L 23/473 |
| | | | 165/287 |
| 2012/0120599 A1 | | 5/2012 | Chua et al. |

OTHER PUBLICATIONS

Machine-generated English language translation of KR 20020091044, downloaded from Google Patents on Sep. 28, 2020.

* cited by examiner

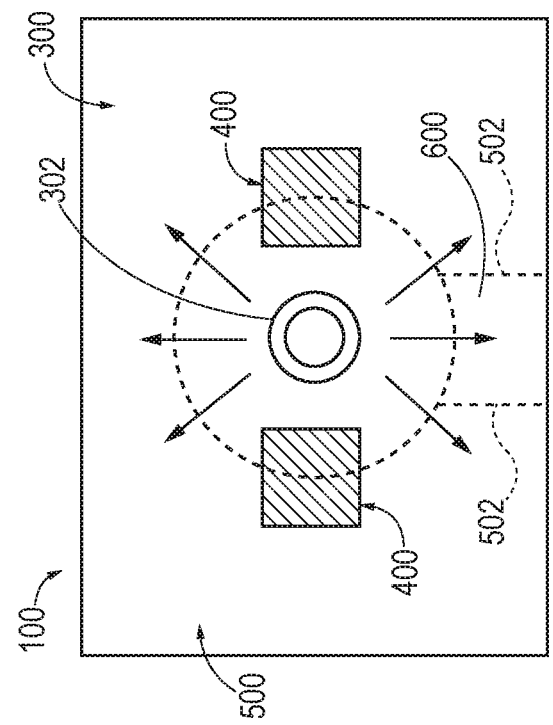
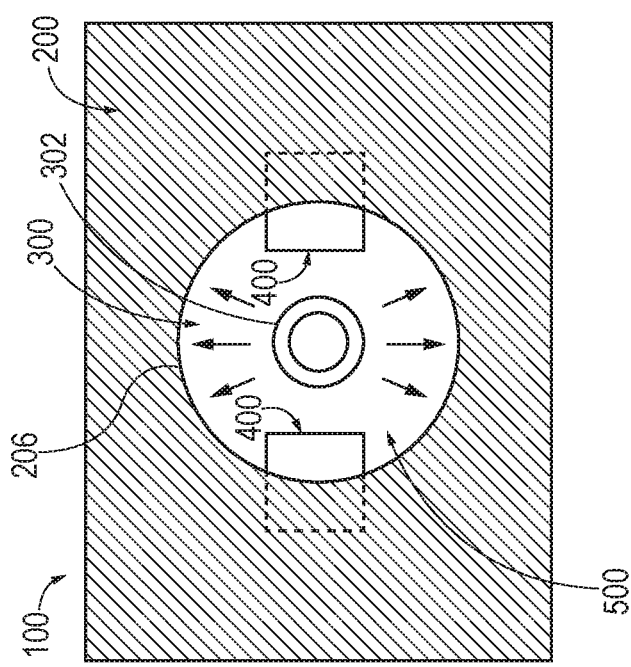
FIG. 4
FIG. 5

HEAT TRANSFER DEVICES AND METHODS OF TRANSFERING HEAT

FIELD

The present disclosure relates to heat transfer devices.

BACKGROUND

Some devices, especially electronic devices, generate extensive amounts of heat, in some cases wasted heat. This heat must be controlled and dissipated properly to prevent reduced performance and/or premature failures. Therefore, the thermal interaction of any device with its environment is a critical design feature to assure its proper functionality.

There are many commercial and military applications that require reliable thermal control systems for small components and/or surfaces. Not only must such thermal control systems be capable of withdrawing heat from small and/or delicate surfaces, they also must ensure that consistent contact is made between the components and/or surfaces and the heat transfer device so as to ensure that heat is reliably and/or optimally drawn from the small components and/or surfaces.

SUMMARY

Heat transfer devices, electronic devices, and methods for heat transfer with an external body are disclosed. A heat transfer device, referred to as a "Stacked Array of Pin Nodes (SPN)" includes a first disc, a second disc positioned adjacent to the first disc, and at least one spacer positioned between the first disc and the second disc. The first disc defines an aperture and comprises a pin cooling structure extending from around the aperture. The pin cooling structure comprises a distal end configured to facilitate heat exchange between the pin cooling structure and an external body and one or more side walls. At least one of the one or more side walls, the distal end, and the aperture at least partially define an internal pin volume. The second disc defines an inlet that is configured to (i) receive a fluid, and (ii) allow the fluid to flow from the inlet and into the internal pin volume. Additionally, a fluid channel is defined between the first disc and the second disc. The fluid channel is in fluid communication with the internal pin volume.

A method includes flowing a fluid from an inlet defined by a second disc of a heat transfer device and into an internal pin volume defined by a pin cooling structure that is a component of a first disc of the heat transfer device that is positioned adjacent to the second disc. The method further includes transferring heat between an external body and the fluid within the internal pin volume via the pin cooling structure, and flowing the fluid from the internal pin volume to a fluid channel that is defined between the second disc and the first disc.

The features, functions, and advantages that have been discussed can be achieved independently in various embodiments or may be combined in yet other embodiments further details of which can be seen with reference to the following description and drawings.

BRIEF DESCRIPTION OF THE DRAWINGS

FIG. 4 illustrates a cross-sectional diagram representing an example embodiment of the aperture of the first disc according to the present disclosure.

FIG. 5 illustrates a cross-sectional diagram representing an example embodiment of the fluid cooling volume according to the present disclosure.

DESCRIPTION

Heat transfer devices and methods for effectuating heat transfer with an external body are disclosed. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

Figure 1:
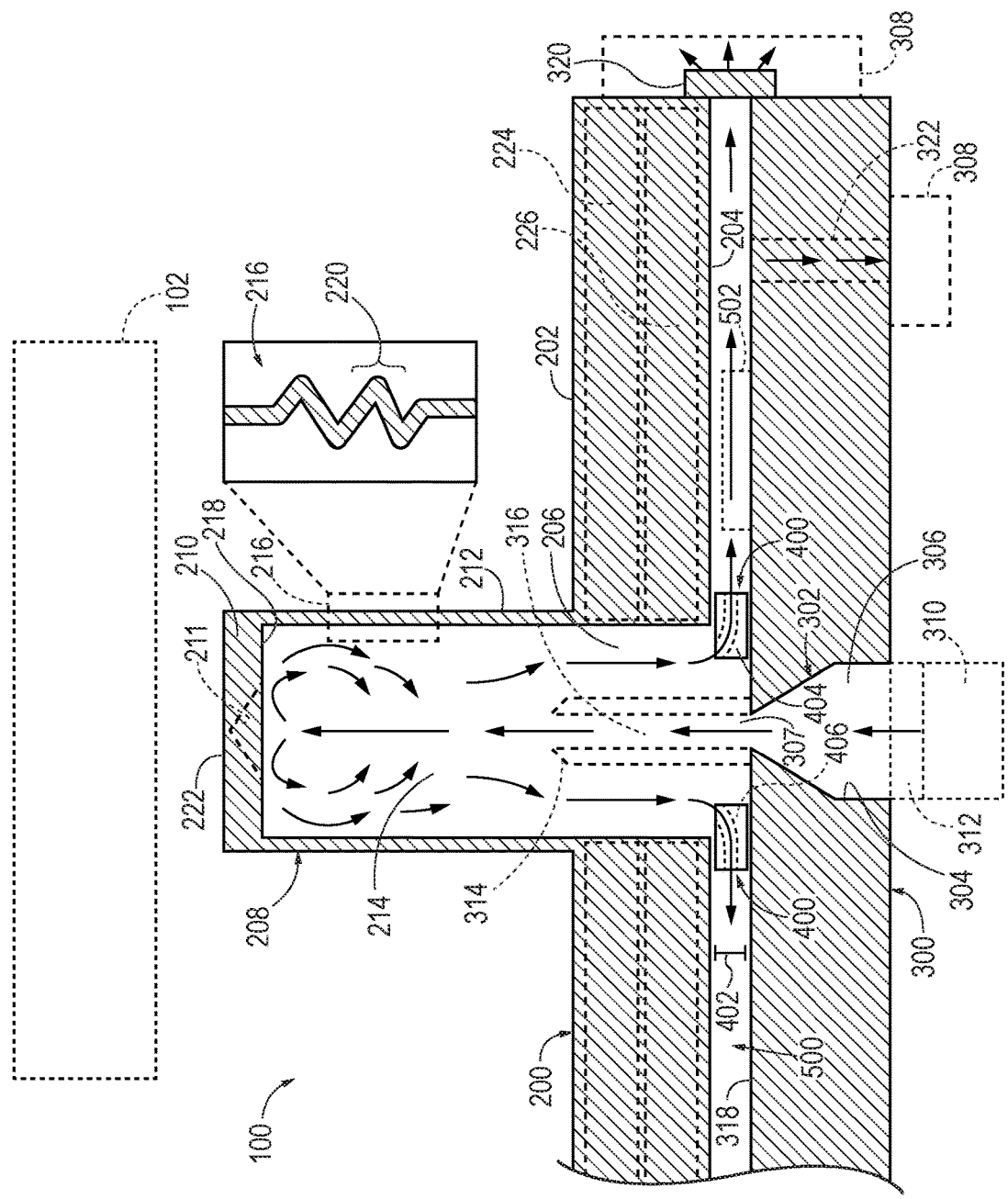
FIG. 1 is schematic cross-sectional diagram representing heat transfer devices according to the present disclosure.

FIG. 1 is a schematic cross-sectional diagram representing heat transfer devices 100 according to the present disclosure. In some embodiments, heat transfer devices 100 may be referred to as a thermal management disc. Heat transfer device 100 may be configured to draw heat away from (i.e., cool) an external body 102, provide heat to (i.e., heat) external body 102, or both. External body 102 may include an active component that generates heat, such as an engine, an electronic device, an electronic component, etc. Alternatively, or in addition, external body 102 may include a component that passively acquires heat from another source, such as a heat shield, a heat sink, etc. In such embodiments, heat transfer device 100 may be configured to draw heat away from external body 102.

As schematically illustrated in FIG. 1, heat transfer devices 100 include at least a first disc 200, a second disc 300 positioned adjacent to first disc 200, and at least one spacer 400 positioned between first disc 200 and second disc 300. Additionally, first disc 200 and second disc 300 define a fluid channel 500 between first disc 200 and second disc 300.

First disc 200 has an outer surface 202 proximate to external body 102 and an inner surface 204 located proximate to and that faces second disc 300. In some embodiments, first disc 200 is circular. However, in various embodiments, first disc 200 may be different shapes, such as oval, ovoid, square, polygonal, etc. First disc 200 defines an aperture 206 that extends through the first disc 200 from outer surface 202 to inner surface 204. First disc 200 further includes a pin cooling structure 208 extending from outer surface 202 around aperture 206. In some embodiments, the angle between pin cooling structure 208 and outer surface 202 is configured to create optimal contact with external body 102. For example, pin cooling structure 208 may be perpendicular with outer surface 202 of first disc 200; however, other angular relationships are within the scope of the present disclosure, such as angular relationships based on the packaging (i.e., the arrangement) of heat transfer device 100 with external body 102. Pin cooling structure 208 comprises a distal end 210 configured to facilitate heat exchange between pin cooling structure 208 and external body 102. Distal end 210 may be composed of one or more materials having a high heat transfer coefficient to ensure efficient heat transfer between external body 102 and pin cooling structure 208. An outer surface 222 of distal end 210 may be post-process machined to a mirror finish or a supermirror finish. Outer surface 222 of distal end 210 may also be in-situ machined to a mirror finish. Alternatively, or in addition, thermal grease may be applied to distal end 210 to improve the thermal conductivity between external body 102 and pin cooling structure 208.

In some embodiments, pin cooling structure 208 is made of, comprises, or optionally includes an electrically conductive material. For example, pin cooling structures 208 may be electrically conductive and may be a component of an electric circuit. Such a circuit may comprise a singular pin cooling structure 208, a plurality of pin cooling structures 208, insulators, resistors, and/or some other element(s). In some embodiments, heating and/or cooling pin cooling structures 208 may alter its electrical properties, including but not limited to changing the resistance of the pin cooling structure and/or creating a break in a current path. As such, an array of pin cooling structures 208 may exhibit an electrical performance (including digital logic) in a low temperature environment (e.g., cryogenic, sub Antarctic or subarctic) that is distinct from an electrical performance in a heated environment (e.g., atmospheric re-entry). Additionally, where the electrical performance of pin cooling structures 208 is temperature dependent, the electrical performance may be altered via localized cooling and/or heating of individual pin cooling structures 208 within an array of pin cooling structures 208. In this way, when pin cooling structures 208 are in contact with a surface of external body 102, an electrical path between external body 102 and one or more pin cooling structures 208 may be broken by a change in temperature, rather than a breakage of physical contact between external body 102 and individual pin cooling structures 208. Moreover, in some embodiments, pin cooling structures 208 may be responsive to magnetic fields. For example, individual pin cooling structures 208 may be constructed of a varied functionally gradient material blend that causes the corresponding pin cooling structures 208 to have a varied response to magnetic fields.

Distal end 210 may have a circular cross section. Alternatively, the cross section of distal end 210 may be another shape. For example, the cross section of distal end 210 may correspond to a 1:1 projection of portion of external body 102 that pin cooling structure 208 is cooling. Moreover, the cross section of distal end 210 may correspond to, or be different from, the cross sectional shape of one or more other regions of pin cooling structure 208. For example, an internal pin volume 214 may have a circular cross-sectional shape while the cross sectional shape of distal end 210 may have a square cross-sectional shape.

Pin cooling structure 208 further includes one or more side walls 212. Side walls 212 at least partially define internal pin volume 214. Internal pin volume 214 may be further partially defined by one or more of distal end 210, aperture 206, and second disc 300. In some embodiments, side walls 212 comprise a micro-bellows 216. Micro-bellows 216 is an elastic region of pin cooling structure 208 that can be compressed when pressure is applied to the outside of pin cooling structure 208 and/or may be expanded when a pressure is applied to an internal surface 218 of distal end 210. For example, expansion of micro-bellows 216 causes distal end 210 of pin cooling structure 208 to be translated away from the second disc 300. When such pressure is released, micro-bellows 216 is configured to return to its original shape. Micro-bellows 216 may include one or more expansion regions 220, such as chevrons, ribs, and/or other corrugated structures, which are capable of expanding or contracting in response to applied pressures. In some embodiments, internal surface 218 of distal end 210 comprises an inset surface 211 opposite outer surface 222. In such embodiments, inset surface 211 may be configured to efficiently receive pressure from the fluid in internal pin volume 214 traveling away from aperture 206. For example, the inset surface may be a conical surface, a dome surface, etc. In this way, inset surface 211 is able to increase the pressure applied to distal end 210 by the fluid in internal pin volume 214. Alternatively, or in addition, the inset surface 211 may be configured to create turbulence in the flow of the fluid when the fluid strikes inset surface 211. The turbulence of the fluid in internal pin volume 214 increases the amount of heat that is absorbed by the fluid from pin cooling structure 208 while the fluid is in internal pin volume 214.

In some embodiments, micro-bellows 216 is configured to expand in response to a fluid being injected into internal pin volume 214 of pin cooling structure 208. Additionally, micro-bellows 216 may be configured to deform in response to distal end 210 of pin cooling structure 208 making contact with external body 102. For example, in response to a force (e.g., a normal force) being exerted on distal end 210 by a surface of external body 102, expansion regions 220 of micro-bellows 216 may deform (i.e., expand, contract, or a combination thereof) so that outer surface 222 of distal end 210 is oriented to more closely parallel the surface of external body 102. In some examples, this deformation of micro-bellows 216 causes outer surface 222 of distal end 210 to make flush contact with the surface of external body 102. In this way, if the surface of external body 102 and outer surface 222 of distal end 210 are not parallel when contact is made between the bodies, micro-bellows 216 may deform so that outer surface 222 of distal end 210 becomes more parallel to the surface of external body 102.

First disc 200 may be a monolithic structure, or may be comprised of multiple components. For example, first disc 200 may optionally comprise a surface layer 224 that includes pin cooling structure 208, and a rigid layer 226 adjacent to surface layer 224 and disposed between surface layer 224 and second disc 300. Surface layer 224 and rigid layer 226 may be composed of the same material, or may be composed of different materials. For example, rigid layer 226 may be composed of a material having a lower modulus of elasticity and/or a higher coefficient of thermal expansion than surface layer 224.

As shown in FIG. 1, heat transfer devices 100 further include second disc 300 positioned adjacent to first disc 200. In various embodiments, first disc 200 and second disc 300 are coupled together via at least one of a mechanical fastener, an adhesive, welding, and/or bonding. In other embodiments, first disc 200 and second disc 300 (as well as other components) may comprise a single body. In some embodiments, the single body may be formed using additive manufacturing, and may at least partially comprise one or more functionally gradient materials (e.g., a grading from Ti-6Al-4V to Vanadium, where the distal pin ends may be malleable).

Second disc 300 defines an inlet 302 that allows fluid to pass from inlet 302 and into internal pin volume 214. The fluid may correspond to a gas or liquid having the ability to absorb and transport heat, such as a coolant. For example, the fluid may be, comprise, or optionally consist of methane and/or methanol gas. In various embodiments, the fluid may be selected based on many different characteristics such as its ability to efficiently transport heat, ability to remain in a stable condition, a boiling temperature, a freezing temperature, an ability to carry a voltage, etc. In some embodiments, the fluid may include component elements that improve the stability of the fluid. For example, the fluid may include a component element that is itself a fire retardant, or which, when combined with other components of the fluid, prevent the fluid from igniting. Alternatively, or in addition, the fluid may include component elements that improve and or provide a voltage-carrying capability of the fluid. For example, the fluid may optionally include a mixture of water and manganese sulfate.

Inlet 302 comprises at least one internal wall 304 that at least partially defines an internal volume 306, and includes an aperture 307 through which fluid passes between inlet 302 and internal pin volume 214. As schematically illustrated in dashed lines in FIG. 1, heat transfer devices 100 also may include one or more of a fluid reservoir 310 and a barrier element 312. For example, heat transfer devices 100 optionally may include fluid reservoir 310, where the fluid flows from fluid reservoir 310 into inlet 302. The fluid may flow directly from fluid reservoir 310 to inlet 302, or may indirectly flow from fluid reservoir 310 to inlet 302 via one or more conduits.

The fluid may flow from fluid reservoir 310 based on a passive driver, such as a passive pressure differential between the fluid and inlet 302, and/or based on an applied pressure, such as a pressure applied by a pump. For example, the fluid may passively flow from fluid reservoir 310 to inlet 302 in response to the temperature of the fluid as stored in fluid reservoir 310 causing the fluid to have a fluid pressure that is greater than the pressure within inlet 302. In some embodiments, the fluid may flow from fluid reservoir 310 to inlet 302 in response to a trigger event. For example, heat transfer device 100 may include one or more barrier elements 312 (e.g., burst discs, permeable membranes, plungers, release valves, pressure release valves, check valves, pyrotechnic valves, solenoid valves, ball and spring valves, etc.) that allow the fluid to flow from fluid reservoir 310 to inlet 302 when in an open configuration, and that restrict the fluid from flowing from fluid reservoir 310 to inlet 302 when in a closed configuration. Such barrier elements 312 may be configured to transform from the closed configuration to the open configuration in response to a trigger event. Example trigger events include heat transfer device 100 reaching a trigger temperature, the fluid reaching a trigger pressure, or an external stimulus triggering barrier element 312 to open.

For example, where barrier element 312 is a permeable membrane, a pressure that the fluid is exerting on the membrane may cause the fluid to flow across the membrane when the exerted pressure exceeds a threshold level. Alternatively, or in addition, barrier element 312 may be a burst disc that is configured to rupture when the fluid reaches a threshold pressure and/or temperature. Alternatively, or in addition, such a burst disc may be ruptured by a rupturing element, such as a puncture needle, a plunger, etc. when the fluid reaches a threshold pressure and/or temperature. In some embodiments, barrier element 312 may transition from a closed configuration to an open configuration in response to an outside stimulus, such as the initiation of an electronic device, a sensor detecting a threshold temperature, a cooling protocol being initiated, etc. The outside stimulus may be transmitted via a physical stimulus or an electronic stimulus/signal.

In one example, the barrier elements 312 may be formed from one or more of an elastomeric, polymeric, and metallic material. Alternatively or in addition, the barrier elements 312 may be formed from one or more of carbon steel, stainless steel, nickel-molybdenum alloys such as Hastelloy®, graphite, aluminum, silicone, and a high temperature rubber compound. In various embodiments, the barrier elements 312 may be located in an aperture that is shaped as a venturi, e.g., having a narrow section located between two wider sections. Alternatively, a corresponding aperture may be conically-shaped with a base of the cone positioned radially outward. In yet another embodiment, a corresponding aperture may be a cylindrical orifice. In such an embodiment, the cylindrical aperture functions as the narrow portion of a venturi.

Additionally, heat transfer devices 100 include fluid channel 500 defined between first disc 200 and second disc 300. Fluid channel 500 is at least partially defined by inner surface 204 of first disc 200 and an inner surface 318 of second disc 300. Fluid channel 500 is in fluid communication with internal pin volume 214. For example, aperture 206 of first disc 200 may open into fluid channel 500 to allow for fluid to pass between aperture 206 and fluid channel 500. Fluid channel 500 then allows the fluid to flow away from internal pin volume 214. For example, fluid channel 500 may allow the fluid to flow radially away from the internal pin volume 214. Alternatively, fluid channel 500 may further be partially defined by one or more channel walls 502 that restrict the fluid so that it flows away from internal pin volume 214 along one or more flow pathways. In some embodiments, heat transfer devices 100 include one or more exit interfaces 320 that partially define fluid channel 500. Exit interface 320 allows fluid to flow from fluid channel 500 to an effusion region 308 (e.g. a storage receptacle, a sewer, an environment of the heat transfer device, etc.) via exit interface 320. In this way, fluid flowing through fluid channel 500 may be exhausted from fluid channel 500 by passing through the at least one exit interface 320 and into effusion region 308.

In some embodiments, heat transfer devices 100 include a chimney 322 through which the fluid is able to flow from fluid channel 500 and through one of first disc 200 and second disc 300. In such embodiments, the fluid is exhausted from fluid channel 500 by flowing through chimney 322 and to an exhaustion, diffusion, and/or effusion region. FIG. 1 shows chimney 322 as being defined by second disc 300; however, in other embodiments, chimney 322 may be at least partially defined by first disc 200, the second disc 300, another component, or a combination thereof.

As schematically illustrated in dashed lines in FIG. 1, inlet 302 optionally may comprise an injector 314 extending from inlet 302 and into internal pin volume 214. Injector 314 may define an internal pin channel 316 that is in fluid communication with both inlet 302 and internal pin volume 214. In some embodiments, injector 314 may extend past fluid channel 500 and/or aperture 307. In this way, internal pin channel 316 provides a flow path through which the fluid can pass from inlet 302 and into internal pin volume 214 at a location beyond fluid channel 500 and in some examples even beyond aperture 307. In this way, the fluid will flow out of injector 314 and toward internal surface 218 of distal end 210, preventing the fluid from partially and/or entirely flowing into fluid channel 500. Thus, injector 314 increases the amount of fluid that applies pressure to internal surface 218 of distal end 210 as well as the amount of turbulence created within internal pin volume 214.

Heat transfer devices 100 further include at least one spacer 400 positioned between first disc 200 and second disc 300. At least one spacer 400 may be in contact with inner surface 204 of first disc 200 and inner surface 318 of second disc 300. One or more spacers 400 define a separation 402 between inner surface 204 of first disc 200 and inner surface 318 of second disc 300. The at least one spacer 400 is configured to allow fluid to pass from internal pin volume 214 to fluid channel 500. That is, at least one spacer 400 both defines separation 402 of fluid channel 500 while also providing a flow path between internal pin volume 214 and fluid channel 500. In an example embodiment, at least one spacer 400 is a plurality of separate spacers, where the spacers partially define a spacer flow pathway 404 between internal pin volume 214 and fluid channel 500. For example, spacer flow pathway 404 may correspond to a volume partially defined by two spacers of the plurality of separate spacers. Alternatively, or in addition, spacer flow pathway 404 may correspond to an internal flow way 406 defined within a spacer, and at least partially defined by the corresponding spacer. In this way, internal flow way 406 allows the fluid to flow from internal pin volume 214 and fluid channel 500 by passing through the corresponding spacer.

One or more component elements of heat transfer device 100 may be formed from plastics, polymers and/or elastomers including but not limited to Nylon, acrylonitrile butadiene styrene, polyactic acid, polyetherimide (ULTEM®), Carbon fiber, para-aramid synthetic fibers (Kevlar®), polychlorotrifluoroethylene, polytetrafluoroethylene (Teflon™), and polyethylene terephthalate. Alternatively, or in addition, portions of the structure may be constructed of flexible material for purposes of resiliency to high-vibration regimes, flexure in aero elastic applications. Alternatively, or in addition, component elements of heat transfer device 100 may be constructed with non-thermoplastic materials, including epoxies, including high-temp resistant epoxies. In some embodiments, one or more component elements of heat transfer device 100 may partially and/or completely comprise one or more shape memory alloys.

Further, component elements of heat transfer device 100 may optionally include support materials, such as support materials for plastics, polymers and/or elastomers like PVA or metallic materials, including water-soluble crystals and other melt-aways, including, but not limited to Cu, Ag, Al, Sb, Zn, and Sn. Such support materials may also include other alloys having a low soldering point and/or melting point such as Ag alloy solder (Ag—Sn—Pb, Ag—Pb, Ag—Sn, Ag—Sn—Cu, Ag—Cd—Zn, Ag—Cd), polyethylene, polyamide, polyimide, polyolefin, polyprophylene, polypropylene, polystyrene, PMMA, polyether sulfone, thermoplastic polyester, copolymer or polyhexafluroropropylene and polytetrafluoroethylene, polyfluorovinylidene, and other organic composite photoresist materials (including but not limited to dry film type resist).

As discussed above, one or more component elements of heat transfer device 100 may be constructed via additive manufacturing. Example additive manufacturing methods and printers include, but are not limited to, VAT photopolymerization, powder bed fusion, binder jetting, bronze infusion/infiltration, material jetting, sheet lamination, material extrusion, directed energy deposition, directed metal laser sintering, direct metal printing, electron beam additive manufacturing, electron beam melting, electron beam powder bed, fused deposition modeling, indirect power bed, laser cladding technology, laser deposition technology, laser deposition welding, laser deposition welding with integrated milling, laser engineering net shape, laser freeform manufacturing technology, laser metal deposition-powder, laser metal deposition-wire, laser powder bed, laser puddle deposition, laser repair technology, powder directed energy deposition, stereolithography, selective laser melting, selective laser sintering, small puddle deposition, atomic diffusion additive manufacturing, Big Area Additive Manufacturing, Bound Metal Deposition, composite-based additive manufacturing, digital light processing, digital light synthesis, gel dispensing printing, high-speed sintering, laminated object manufacturing, multi-jet fusion, Quantum & Nano-pico-femto-atto-scale Manufacturing (QUN), Rapid Plasma Deposition, Selective Deposition Lamination, Single-Pass Jetting, Ultrasonic Additive Manufacturing, Ytterbium In-situ Manufacturing (YIM), as well as hybrid processes thereof. For example, powder may be formed as collected waste powder or produced powder from Electrical Discharge Machining (EDM) machining processes.

Potential additive manufacturing materials include metals such as steel, stainless steel, Elgiloy®, titanium, copper, bronze, Hastalloy, zinc, aluminum, nickel alloys, and alloys thereof, including but not limited to IN600, IN625, IN718, Ti-6Al-4V, AlSi10Mg, SS316, Monel, Monel K500, Copper, Ti-5553, Ti-6Al-6V-2Sn, Ti-6242, Maraging Steel MSI 18, Mar 300, 316L, 17-4, 15-4, Cobalt Chrome SP2, Zircalloy, Niobium (NB), Molybdenum, Vitallium, Vanadium, Ti-6Al-4V ELI, Nickel Alloy HX, gold (au), silver (ag), as well as plastics, polymers and/or elastomers, including Acrylonitile Butadiene Styrene (ABS), Polylactic acid (PLA), Polyvinyl Chloride, PTFE, Acetal, Delrin®, Polyvinyl alcohol, and Polycarbonate, and others including ULTEM®/PPSF/PPSU, Kel-F, Kevlar®, Nylon, Nomex®, fabrics, Polybenzimidazole (PBI), glass, and Carbon Composite, Boron Nitride (BN), as well as thermoplastics such as Polyamide (PA), Polyphenylene Sulfide (PPS), Polyether Ether Ketone (PEEK), Poly-Ether-Ketone-Ketone (PEKK), Polyetherimide (PEI), Polyphenylsulfone (PPSU), Polyethersulfone (PES), Thermoplastic Polyimide (TPI), liquid crystalline polymer (LCP), polyimide-imide (PAI), or the like. Heat transfer device 100 disclosed herein may also be partially or completely formed of, or may otherwise include functionally gradient materials. In one example, the component elements of heat transfer device 100 optionally may be formed by altering the blending of deposited additively manufactured material such that functionally gradient material properties may be achieved, including varying the Coefficient of Thermal Expansion (CTE).

Turning now to FIGS. 2-9, illustrative non-exclusive examples of heat transfer devices 100 are illustrated. Where appropriate, the reference numerals from the schematic illustrations of FIG. 1 are used to designate corresponding parts of the examples of FIGS. 2-9; however, the examples of FIGS. 2-9 are non-exclusive and do not limit heat transfer devices 100 to the illustrated embodiments of FIGS. 2-9. That is, heat transfer devices 100 are not limited to the specific embodiments depicted in FIGS. 2-9, and heat transfer devices 100 may incorporate any number of the various aspects, configurations, characteristics, properties, etc. of heat transfer devices that are illustrated in and discussed with reference to the schematic representations of FIG. 1 and/or the embodiments of FIGS. 2 9, as well as variations thereof, without requiring the inclusion of all such aspects, configurations, characteristics, properties, etc. For the purpose of brevity, each previously discussed component, part, portion, aspect, region, etc. or variants thereof may not be discussed, illustrated, and/or labeled again with respect to the examples of FIGS. 2-9; however, it is within the scope of the present disclosure that the previously discussed features, variants, etc. may be utilized with the examples of FIGS. 2-9.

Figure 2:
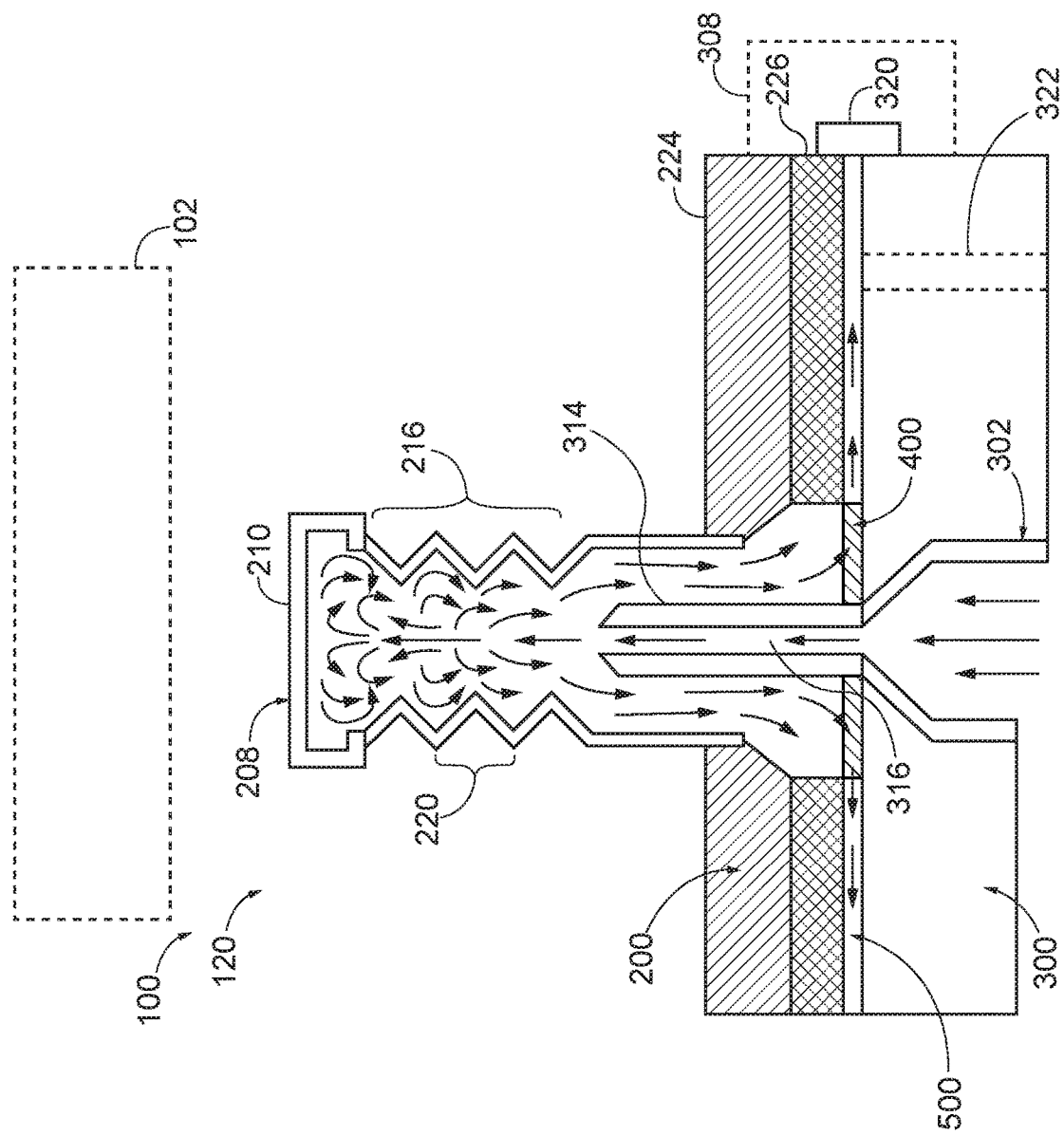
FIG. 2 illustrates a cross-sectional diagram representing example heat transfer devices comprising a bellows and constructed of multiple component elements.

FIG. 2 illustrates a cross section of an example embodiment 120 of heat transfer devices 100 comprising micro-bellows 216 and constructed of multiple component elements. As shown in FIG. 2, example embodiment 120 of heat transfer device 100 includes surface layer 224 that includes pin cooling structure 208, rigid layer 226 adjacent to surface layer 224, and second disc 300 defining inlet 302 and positioned adjacent to rigid layer 226 such that rigid layer 226 is disposed between surface layer 224 and second disc 300. In some embodiments, the component elements of heat transfer device 100 (i.e., surface layer 224, rigid layer 226, and second disc 300) may be assembled separately and then assembled together to form example embodiment 120 of heat transfer device 100 shown in FIG. 2. For example, individual components may be printed using additive manufacturing. When the component elements are generated separately, this allows a quality control check to be conducted to ensure proper formation before assembly of the heat transfer device 100.

The component elements of heat transfer device 100 may individually be composed of a same material, may be composed of different materials, or a combination thereof. For example, rigid layer 226 and second disc 300 may be composed of a material having a lower modulus of elasticity and/or a higher coefficient of thermal expansion than surface layer 224. In another example, surface layer 224 may be composed of a material having a higher thermal conductivity and/or electrical conductivity, allowing pin cooling structures 208 to be a better conduit for the flow of heat and/or electricity between external body 102 and heat transfer device 100.

FIG. 2 also shows the fluid pathway of fluid within heat transfer device 100. For example, FIG. 2 shows fluid flowing into inlet 302. In various embodiments, the fluid may flow into inlet 302 directly or indirectly from fluid reservoir 310. The fluid then flows out of injector 314 extending from inlet 302 and into internal pin volume 214. FIG. 2 shows the fluid pathway as optionally narrowing between inlet 302 and injector 314. This narrowing causes an increase in the velocity of the fluid as it enters internal pin volume 214.

The increase in velocity of the fluid as it enters internal pin volume 214 increases the pressure applied to distal end 210 of pin cooling structure 208 when the fluid impacts internal surface 218 of distal end 210. This pressure applied to the distal end causes micro-bellows 216 to expand, which in turn causes distal end 210 of pin cooling structure 208 to be translated away from second disc 300. For example, in response to a pressure being applied to internal surface 218 of distal end 210, one or more expansion regions 220 (e.g., chevrons and/or ribs) of micro-bellows 216 expand. This translation increases the amount of heat that flows into pin cooling structure 208 from external body 102. For example, the translation may cause distal end 210 to be more proximate to external body 102, increasing the amount of heat transmitted via radiation and/or convection to pin cooling structure 208 from external body 102. Alternatively, or in addition, the translation may cause distal end 210 to make physical contact and/or make a more flush contact with a surface of external body 102, allowing and/or increasing the heat transmitted between pin cooling structures 208 from external body 102 via conduction.

As shown in FIG. 2, the fluid impacting internal surface 218 of distal end 210 also causes flow turbulence within internal pin volume 214. This turbulence increases the opportunity for heat to flow from pin cooling structure 208 and into the fluid in internal pin volume 214. FIG. 2 further shows the fluid (and the heat absorbed from pin cooling structure 208 while the fluid was in internal pin volume 214) flowing out of internal pin volume 214 and into fluid channel 500. When flowing into fluid channel 500, the fluid may flow past, between, and/or through one or more spacers 400. The fluid and the heat then flow within fluid channel 500 away from pin cooling structure 208. In some embodiments, the fluid and the heat may flow into chimney 322 and/or exit interface 320 where it is exhausted into effusion/diffusion region 308, such as a storage receptacle, a sewer, an environment of the heat transfer device, etc.

Figure 3:
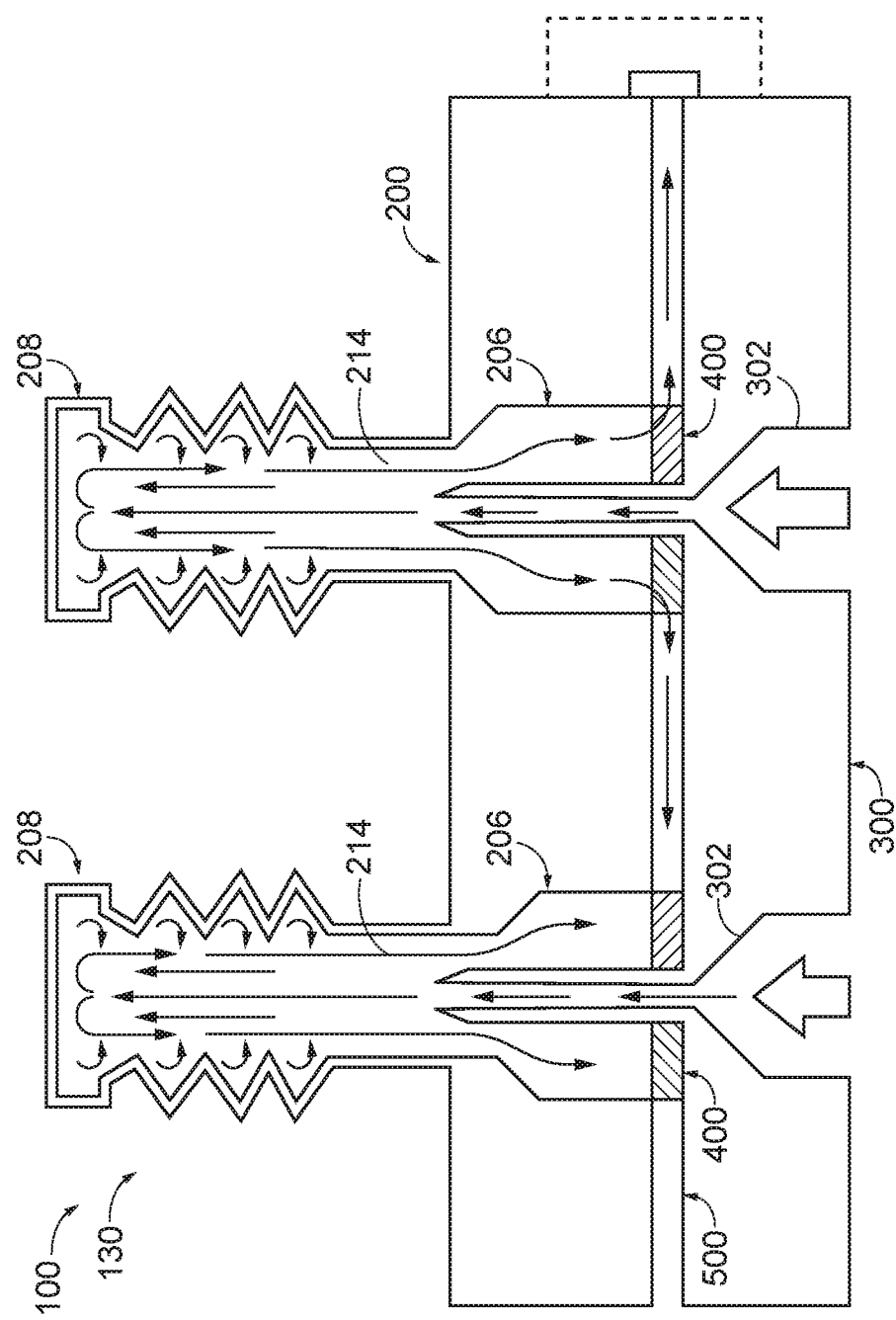
FIG. 3 illustrates a cross-sectional diagram representing example heat transfer devices showing a plurality of pin cooling structures, and composed of a monolithic structure.

FIG. 3 illustrates a cross section of an example embodiment 130 of heat transfer devices 100 showing a plurality of pin cooling structures 208, and composed of a monolithic structure. As shown in FIG. 3, each of first disc 200, second disc 300 positioned adjacent to rigid layer 226, and one or more spacers 400 of example embodiment 130 of heat transfer device 100 are formed of a single body. In some embodiments, the single body may be formed using additive manufacturing, and may at least partially comprise one or more functionally gradient materials and/or shape memory alloys. FIG. 3 also shows first disc 200 as defining a plurality of apertures 206 and a plurality of pin cooling structures 208, wherein individual pin cooling structures 208 extend from corresponding aperture 206. FIG. 3 further shows second disc 300 as comprising a plurality of inlets 302, wherein each inlet 302 of the plurality of inlets 302 is configured to allow the fluid to flow from inlet 302 and into a corresponding internal pin volume 214 defined by a corresponding pin cooling structure 208 of the plurality of pin cooling structures 208.

FIGS. 4-5 illustrate cross sections of the unique AM heat transfer device 100 that illustrate the flow of fluid into fluid channel 500. FIG. 4 illustrates cross sections of an example embodiment of the aperture 206 of first disc 200 according to the present disclosure. Specifically, FIG. 4 illustrates a cross section of first disc 200 and aperture 206 which depicts inlet 302 defined by second disc 300, and a plurality of spacers 400. FIG. 4 also shows fluid pathways where the fluid is able to flow into fluid channel 500 around and/or between spacers 400. FIG. 5 illustrates cross sections of an example embodiment of fluid channel 500 according to the present disclosure. Specifically, FIG. 5 illustrates a cross section of the plurality of spacers 400 and fluid channel 500 which depicts inlet 302 defined by second disc 300. FIG. 5 further illustrates fluid pathways along which the fluid is able to flow through fluid channel 500 away from inlet 302. FIG. 5 further shows optional channel walls 502 that restrict the fluid so that it flows away from inlet 302 through a particular channel flow pathway 600.

Figure 6:
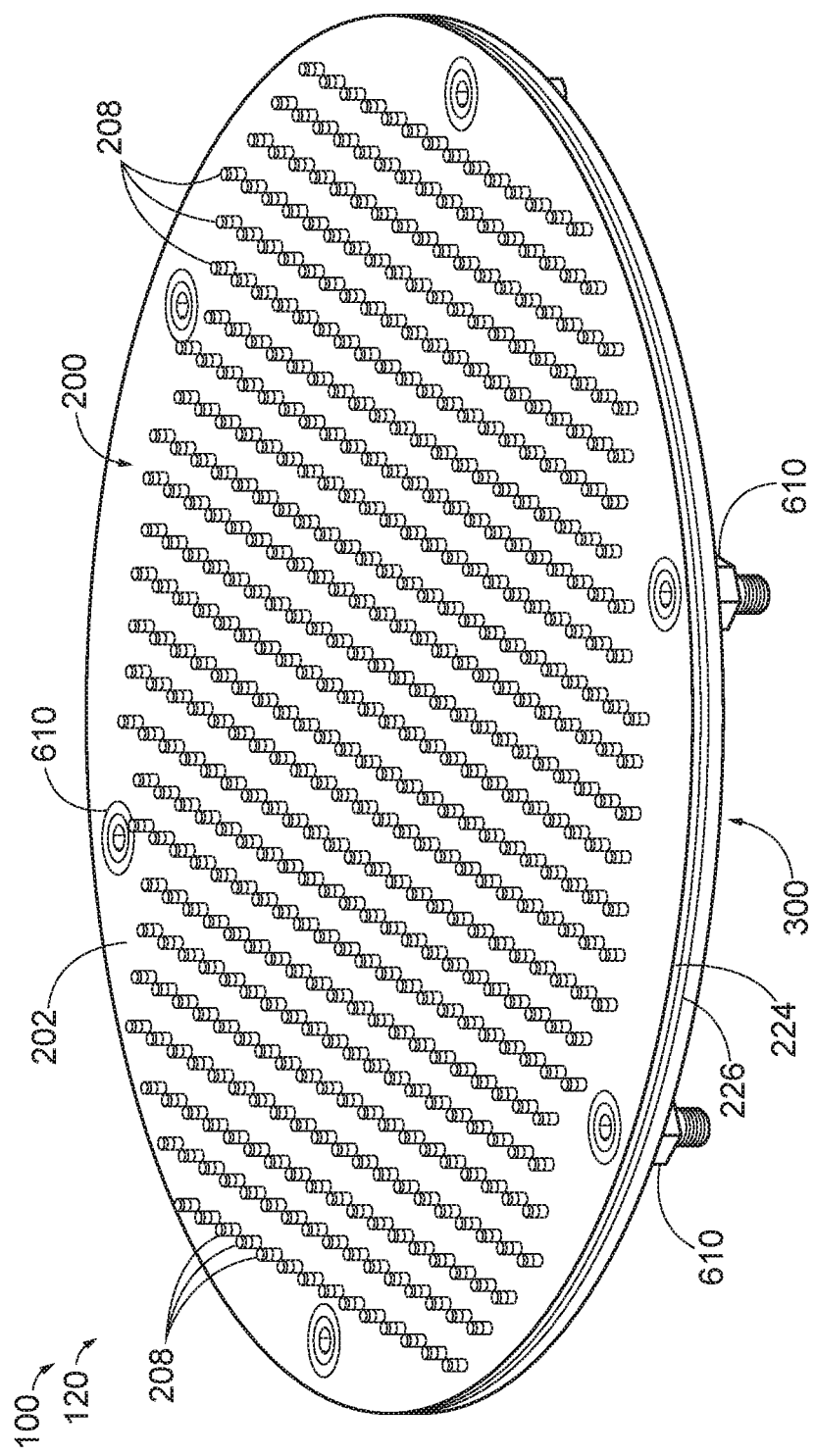
FIG. 6 is a perspective view of the heat transfer device of FIG. 2.
Figure 7:
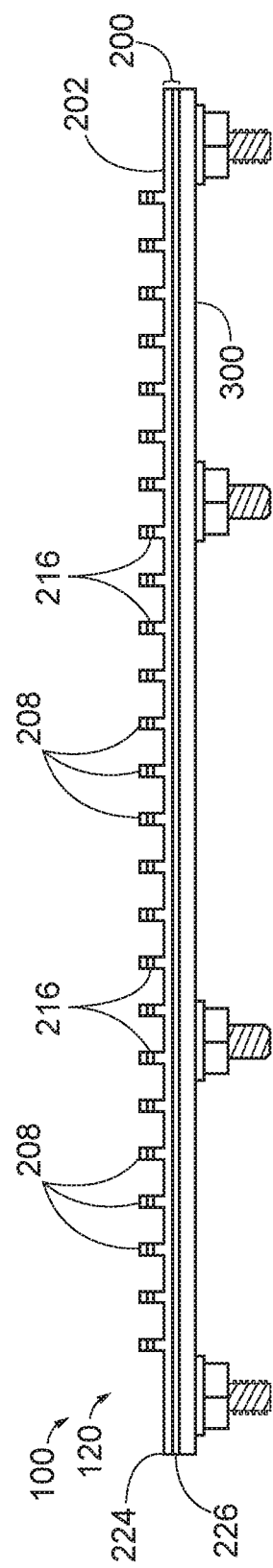
FIG. 7 is a side view of the example heat transfer device of FIG. 2.

FIGS. 6-7 are a perspective view and a side view of heat transfer device 100. FIGS. 6-7 show first disc 200 coupled to second disc 300 via a plurality of attaching mechanisms 610. FIGS. 6-7 illustrate attaching mechanisms 610 as being counter sunk threaded fasteners, which enable the attaching mechanisms 610 to be flush with outer surface 202 of first disc 200. However, in various embodiments attaching mechanisms 610 may correspond to any combination of mechanical fasteners, adhesives, welding, and/or bonding between first disc 200 and second disc 300. In some embodiments, heat transfer device 100 further comprises an adapter configured to affix the heat transfer device to a separate component. Also as shown in FIGS. 6-7, first disc 200 may be made up of surface layer 224 and rigid layer 226.

FIGS. 6-7 also show a plurality of pin cooling structures 208 that extend from outer surface 202 of first disc 200. FIG. 6 shows heat transfer device 100 as having a circular shape. However, in other embodiments the heat transfer device may have another shape, such as oval, ovoid, square, polygonal, etc. In some embodiments, the shape of heat transfer device 100 may reflect or otherwise be based on a shape and/or characteristics of a separate body 102. Moreover, in some embodiments, heat transfer device 100 may conformably wrap about a toroid, Vesica Pisces and/or thruster shape. The plurality of pin cooling structures 208 are illustrated in FIG. 6 as being arranged in a matrix array. However, in alternative embodiments, pin cooling structures 208 may be arranged in any number of arrays such as radially symmetric patterns, offset matrix arrays, circular arrays, polygonal arrays, etc. Additionally, the arrangement of pin cooling structures 208 may be designed to reflect and/or align with external/separate body 102. For example, pin cooling structures 208 may be positioned so that they align with and/or contact regions of external/separate body 102 that generate and/or absorb excess heat.

Figure 8:
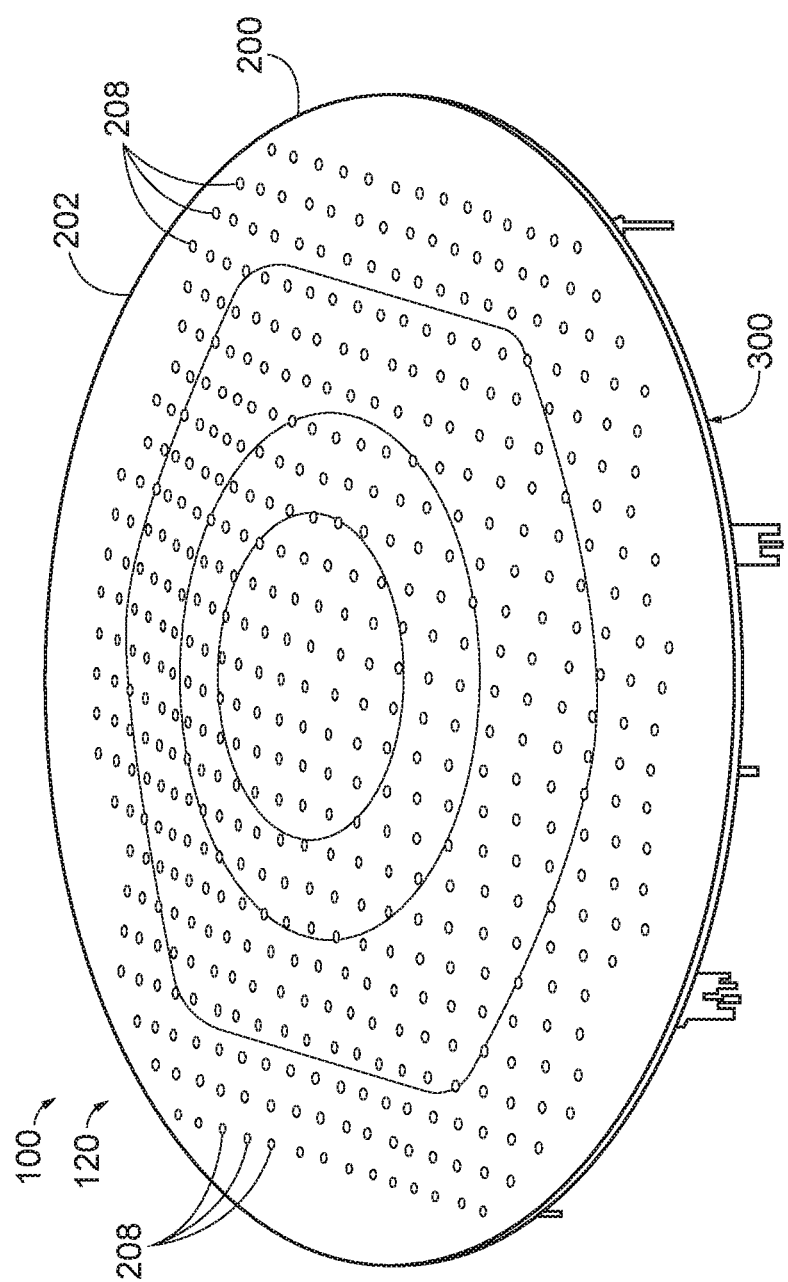
FIG. 8 is a perspective view of the heat transfer device of FIG. 2 illustrating a temperature based deformation thereof.

FIG. 8 is a perspective view of example embodiment 120 of heat transfer device 100 of FIG. 2 illustrating a temperature based deformation thereof. Specifically, FIG. 8 shows a deformation pattern (i.e., an altered shape or geometry) of example embodiment 120 of heat transfer device 100 based on a temperature of heat transfer device 100. As heat transfer device 100 absorbs heat, first disc 200, second disc 300, or both may deform. That is, first disc 200 and/or second disc 300 may be composed of materials that deform responsive to a temperature change. In some embodiments, materials of first disc 200 and/or second disc 300 may be configured to so that heat transfer device 100 achieves a target deformation pattern (i.e., a desired shape or geometry) when heat transfer device 100 reaches a target temperature. For example, one or both of first disc 200 and second disc 300 may be composed of functionally gradient materials, where the properties (e.g., the coefficient of thermal expansion) of the functionally gradient materials are varied such as to cause one or both of first disc 200 and second disc 300 to achieve a target geometry when heat transfer device 100 reaches a target/threshhold temperature.

In some embodiments, the component materials of first disc 200 and/or second disc 300 are configured such that the patterns of the deformation of first disc 200 and/or second disc 300 responsive to a temperature change may be characterized by one or more mathematical representations, such as, for example, via a periodic convolution and/or periodic summation of one or more Zernike polynomials. Example Zernike polynomials may include sec spherical, primary septafoil, sec trefoil, sec tetrafoil, etc. For further discussion on the modeling of deformations see Doyle, Keith B, Genberg, Victor L., and Michels, Gregory J. *Integrated Optomechanical Analysis*, Bellingham, Wash.: SPIE Press, 2002. In some embodiments, the deformation of first disc 200 and/or second disc 300 causes pin cooling structures 208 to be translated as the temperature of heat transfer device 100 increases. Such a translation may correspond to pin cooling structures 208 moving to a position more proximate to and/or better aligning with external body 102.

Figure 9:
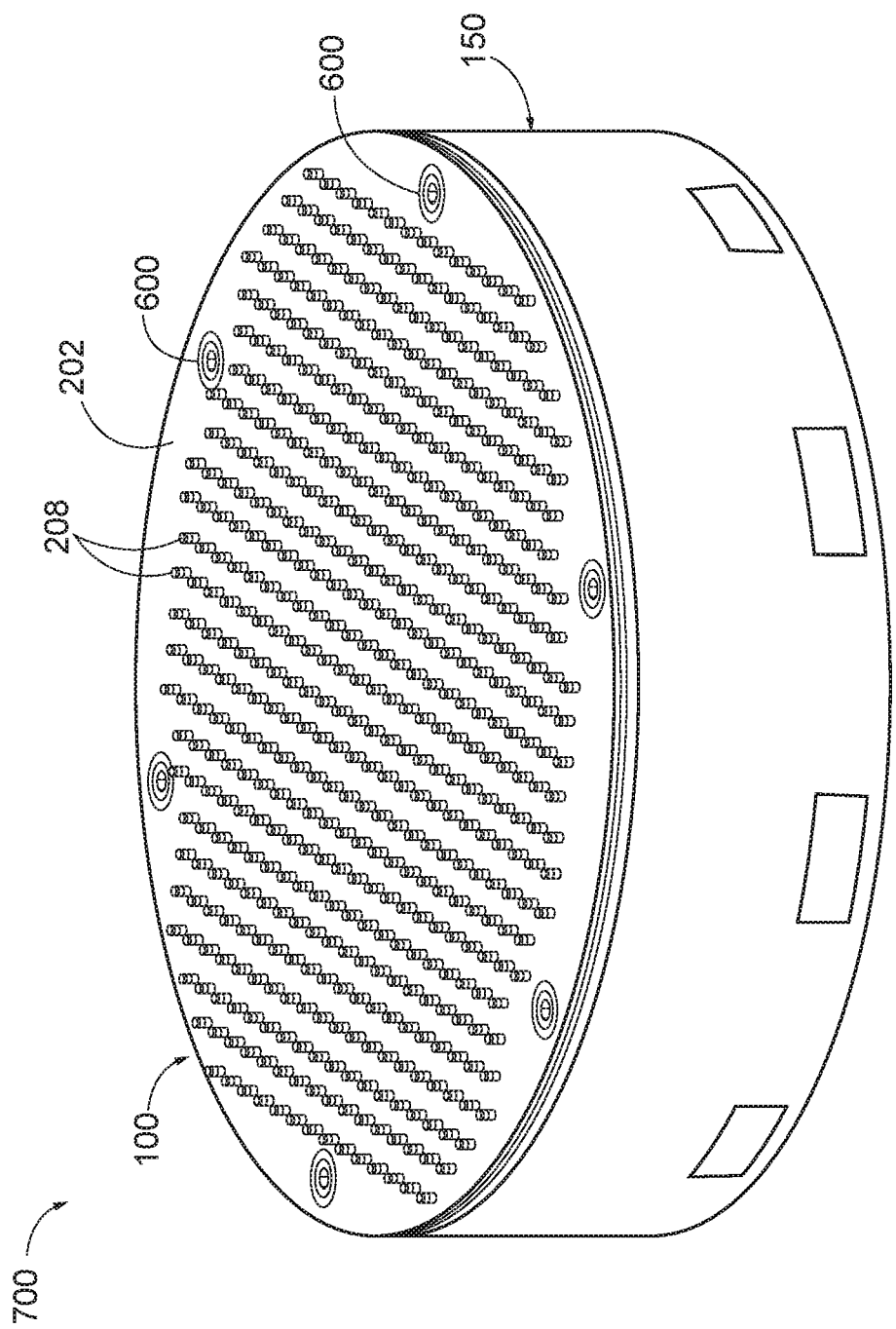
FIG. 9 is a perspective view of an example heat transfer device as a component portion of a heat transfer puck according to the present disclosure.

FIG. 9 is a perspective view of example embodiment 120 of heat transfer device 100 as a component portion of a heat transfer puck 150 according to the present disclosure. Specifically, FIG. 9 illustrates heat transfer apparatus 700 where heat transfer device 100 is mounted to the heat transfer puck 150. The heat transfer puck 150 may include a mechanism for releasing fluid. Once the fluid is released by heat transfer puck 150, the fluid may flow into inlet 302 of heat transfer device 100. The fluid may then flow along a fluid pathway through heat transfer device 100. In this way, in response to heat transfer puck 150 releasing the fluid, heat transfer device 100 may cool external body 102. In some embodiments, heat transfer puck 150 may include one or more reservoirs for storing fluid. Alternatively, heat transfer puck 150 may selectively receive fluid from an external reservoir, and allow the fluid to subsequently flow to the heat transfer device 100.

Heat transfer device 100 may comprise an adapter configured to affix heat transfer device 100 to heat transfer puck 150 or other device(s). The adapter may correspond to, or be separate from attaching mechanisms 610. Heat transfer device 100 may be located within and/or affixed to a structure that is impenetrable by non-destructive Inspection (NDI) devices, including, but not limited to, x-ray (radiography), computed tomography (CT) scanning, ultrasonic testing (UT), etc. Moreover, heat transfer device 100 may be connected (including electrically) to one or more other devices that are identical or non-identical in properties including electrical and/or mechanical performance. Heat transfer device 100 may rotate, revolve, and/or translate with respect to an attaching surface and/or other devices (such as via bearings and/or electrically conductive bearings).

In embodiments where heat transfer device 100 may rotate, revolve, and/or translate, heat transfer device 100 may be functional in a singular position with respect to another surface, and/or in a plurality of positions with respect to the another surface. Additionally, the heat transfer device 100 may exhibit an altered performance (including mechanical performance and/or electrical performance) when based on the position of heat transfer device 100 of the plurality of positions.

Figure 10:
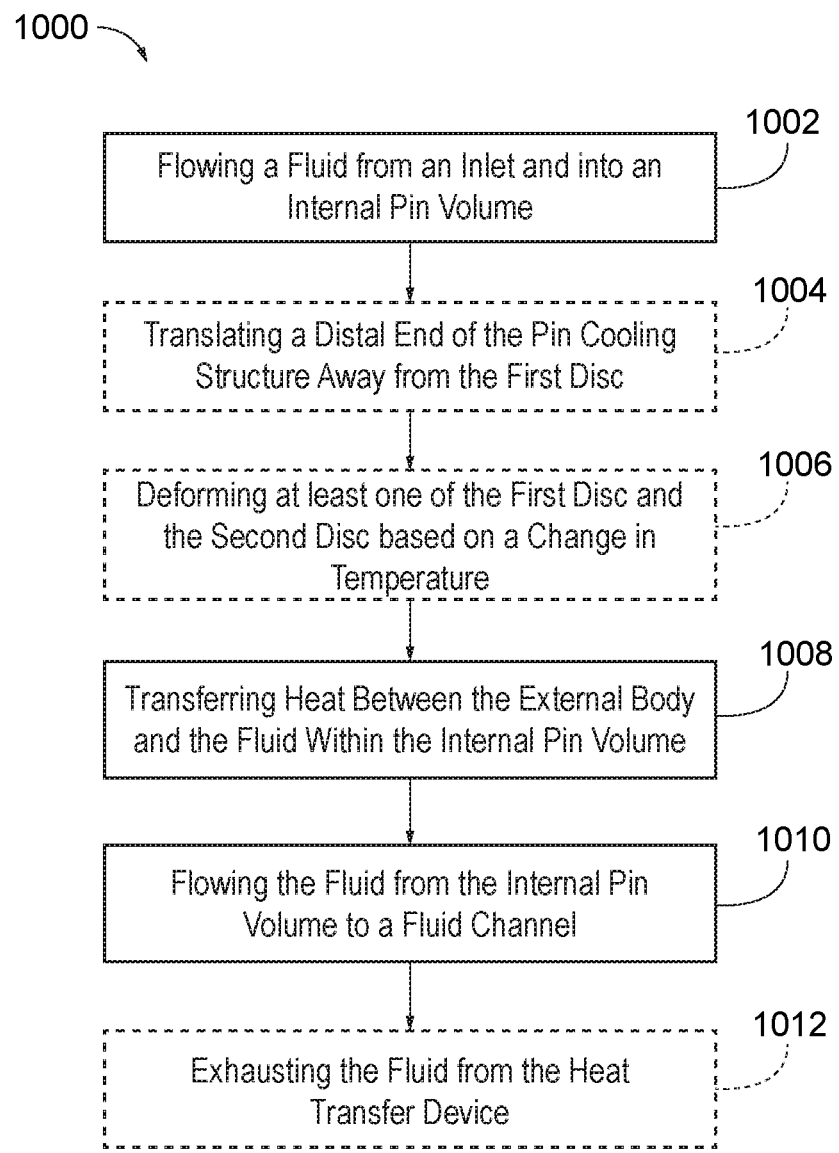
FIG. 10 is a flowchart schematically representing methods for conducting heat transfer with an external body according to the present disclosure.

FIG. 10 schematically provides a flowchart that represents illustrative, non-exclusive examples of methods 1000 according to the present disclosure. In FIG. 10, some steps are illustrated in dashed boxes indicating that such steps may be optional or may correspond to an optional version of a method according to the present disclosure. That said, not all methods according to the present disclosure are required to include the steps illustrated in solid boxes. The methods and steps illustrated in FIG. 10 are not limiting and other methods and steps are within the scope of the present disclosure, including methods having greater than or fewer than the number of steps illustrated, as understood from the discussions herein.

FIG. 10 is a flowchart schematically representing methods for conducting heat transfer with an external/separate body according to the present disclosure. Methods 1000 include flowing a fluid from inlet 302 and into internal pin volume 214 at 1002. For example, the fluid may be flowed from inlet 302 defined by second disc 300 of heat transfer device 100 and into internal pin volume 214 defined by pin cooling structure 208. Pin cooling structure 208 is a component of first disc 200 of heat transfer device 100. First disc 200 is positioned adjacent to second disc 300. The fluid may flow from inlet 302 based on a passive driver, such as a passive pressure differential between the fluid and inlet 302, and/or based on an applied pressure, such as a pressure applied by a pump. In embodiments where heat transfer device 100 includes fluid reservoir 310, the flowing of the fluid from inlet 302 in step 1002 may further comprise flowing the fluid from fluid reservoir 310 and into inlet 302. The fluid may flow directly from fluid reservoir 310 to inlet 302, or may indirectly flow from fluid reservoir 310 to inlet 302 via one or more conduits.

Where heat transfer device 100 includes barrier element 312 (e.g., a burst disc, a permeable membrane, a plunger, a release valve, a pressure release valve, a check valve, a pyrotechnic valve, a solenoid valve, a ball and spring valve, etc.), the flowing of the fluid from inlet 302 may be in response to a trigger event. Example trigger events may include heat transfer device 100 reaching a trigger temperature; the fluid reaching a trigger pressure; or an external stimulus triggering barrier element 312 to open.

Methods 1000 optionally may include translating distal end 210 of the pin cooling structure 208 away from first disc 200. The translating of distal end 210 may include causing the distal end 210 to contact an external body 102. In some embodiments, the translation of distal end 210 may be based at least in part on the fluid flowing into internal pin volume 214. In some embodiments, pin cooling structure 208 comprises micro-bellows 216, and wherein the translating distal end 210 of pin cooling structure 208 toward external body 102 corresponds at least in part to micro-bellows 216 expanding. Micro-bellows 216 is an elastic vessel that can be expanded when a pressure is applied to internal surface 218 of distal end 210. For example, expansion of micro-bellows 216 causes distal end 210 of pin cooling structure 208 to be translated away from second disc 300. Micro-bellows 216 may include one or more expansion regions 220, such as chevrons and/or ribs, which are capable of expanding or contracting in response to applied pressures. In some embodiments, internal surface 218 of distal end 210 comprises inset surface 211 opposite aperture 206. In such embodiments, inset surface 211 may be configured to efficiently receive pressure from the fluid in internal pin volume 214 traveling away from aperture 206.

Methods 1000 also may optionally include deforming at least one of first disc 200 and second disc 300 based on a change in temperature at step 1006. For example, first disc 200 and/or second disc 300 may be composed of materials that deform responsive to a temperature change. Thus, in some embodiments, materials of first disc 200 and/or second disc 300 may be configured so that heat transfer device 100 achieves a target shape when heat transfer device 100 reaches a target temperature. For example, one or both of first disc 200 and second disc 300 may be composed of functionally gradient materials, where the properties of the functionally gradient materials cause one or both of first disc 200 and second disc 300 to achieve a target shape when heat transfer device 100 reaches a target/threshold temperature. Such a deformation of first disc 200 and/or second disc 300 responsive to a temperature change may be characterized by one or more mathematical representations, such as, for example, one or more Zernike polynomials. Additionally, the deformation may cause pin cooling structures 208 extending from first disc 200 to be translated as the temperature of heat transfer device 100 increases.

At step 1008, heat is transferred between external body 102 and the fluid within internal pin volume 214 via pin cooling structure 208. For example, heat may first be transferred between external/separate body 102 and pin cooling structure 208, and then subsequently transferred from pin cooling structure 208 and to the fluid within internal pin volume 214. The heat may be transferred by any combination of conduction, radiation, and convection.

At step 1010, the fluid is flowed from internal pin volume 214 and into fluid channel 500. Fluid channel 500 is at least partially defined by second disc 300 and first disc 200. In some embodiments, the fluid flows through a spacer flow pathway 404 defined by a combination of inner surface 204 of first disc 200, inner surface 318 of second disc 300 and a plurality of spacers 400. For example, spacer flow pathway 404 may correspond to a volume partially defined by two spacers of the plurality of separate spacers 400. Alternatively, or in addition, spacer flow pathway 404 may correspond to an internal flow way 406 defined within spacer 400, and at least partially defined by corresponding spacer 400. In this way, internal flow way 406 allows the fluid to flow from internal pin volume 214 and fluid channel 500 by passing through corresponding spacer 400.

At step 1012, methods 1000 also may optionally include exhausting the fluid from heat transfer device 100. For example, the fluid may flow within fluid channel 500 until it reaches exit interface 320 and/or chimney 322. The fluid may then be exhausted into effusion/diffusion region 308, such as a storage receptacle, a sewer/chimney, an environment of the heat transfer device, etc. In this way, by exhausting the fluid, the heat absorbed from external body 102 is exhausted from the heat transfer device 100 along with the fluid.

Illustrative, non-exclusive examples of inventive subject matter according to the present disclosure are described in the following enumerated paragraphs:

A1. A heat transfer device, comprising: a first disc defining an aperture and comprising a pin cooling structure extending from around the aperture, the pin cooling structure comprising:

a distal end configured to facilitate heat exchange between the pin cooling structure and an external body; and one or more side walls, wherein at least one of the one or more side walls, the distal end, and the aperture at least partially define an internal pin volume;

a second disc positioned adjacent to the first disc defining an inlet, wherein the inlet is configured to: receive a fluid; and allow the fluid to flow from the inlet and into the internal pin volume;

at least one spacer positioned between the first disc and the second disc; and wherein a fluid channel is defined between the first disc and the second disc, and wherein the fluid channel is in fluid communication with the internal pin volume.

A2. The heat transfer device of paragraph A1, wherein the first disc, the second disc, and the at least one spacer are formed of a single body.

A3. The heat transfer device of paragraph A2, wherein the single body is formed using additive manufacturing.

A4. The heat transfer device of any of paragraphs A1-A3, wherein the heat transfer device is composed of one or more functionally gradient materials.

A5. The heat transfer device of any of paragraphs A1-A4, wherein the second disc further comprises an injector extending from the inlet and into the internal pin volume.

A6. The heat transfer device of paragraph A5, wherein the injector defines a pin channel configured to allow the fluid to flow from the inlet and into the internal pin volume.

A7. The heat transfer device of any of paragraphs A1-A6, wherein the internal pin volume is further defined by the second disc.

A8. The heat transfer device of any of paragraphs A1 and A5-A7, wherein the first disc and the second disc are coupled together via at least one of a mechanical fastener, an adhesive, welding, and/or bonding.

A9. The heat transfer device of any of paragraphs A1-A8, wherein the fluid channel is further defined by one or more channel walls that direct the flow of fluid away from the internal pin volume and along a flow pathway.

A10. The heat transfer device of any of paragraphs A1-A8, wherein the fluid channel is configured to direct the fluid to flow radially away from the internal pin volume in all directions.

A11. The heat transfer device of any of paragraphs A1-A10, wherein the one or more side walls of the pin cooling structure comprise a micro-bellows.

A12. The heat transfer device of paragraph A11, wherein the micro-bellows is configured to expand.

A13. The heat transfer device of paragraph A12, wherein expansion of the micro-bellows causes the distal end of the pin cooling structure to be translated away from the second disc.

A14. The heat transfer device of any of paragraphs A12-A13, wherein the micro-bellows is configured to expand in response to the fluid being injected into the internal pin volume of the pin cooling structure.

A15. The heat transfer device of any of paragraphs A11-14, wherein the micro-bellows is configured to deform in response to the distal end of the pin cooling structure making contact with the external body, and wherein the contact between the distal end of the pin cooling structure and the external body is flush based on the deformation of the micro-bellows.

A16. The heat transfer device of paragraph A15, wherein the micro-bellows is configured to deform in response to a normal force received by the distal end of the pin cooling structure and from the external body.

A17. The heat transfer device of any of paragraphs A1-A16, further comprising a fluid reservoir configured to allow the fluid to flow into the inlet from the fluid reservoir.

A18. The heat transfer device of paragraph A17, wherein the heat transfer device is configured to allow the fluid to flow into the inlet from the fluid reservoir in response to a trigger event.

A18.1. The heat transfer device of paragraph A18, wherein the trigger event corresponds to at least one of:
the heat transfer device reaching a trigger temperature;
the fluid reaching a trigger pressure; or
an external stimulus triggering a fluid barrier to open.

A19. The heat transfer device of any of paragraphs A1-A18.1, wherein an internal surface of the distal end of the pin cooling structure comprises a conical surface opposite the inlet.

A20. The heat transfer device of any of paragraphs A1-A19, wherein the first disc further defines a plurality of apertures and further comprises a plurality of corresponding pin cooling structures.

A21. The heat transfer device of paragraph A20, wherein the second disc further comprises a plurality of inlets, wherein each inlet of the plurality of inlets is configured to allow the fluid to flow from the inlet and into a corresponding internal pin volume defined by a corresponding pin cooling structure of the plurality of pin cooling structures.

A22. The heat transfer device of any of paragraphs A20-A21, wherein the plurality of pin cooling structures are arranged in a matrix array.

A23. The heat transfer device of any of paragraphs A20-A21, wherein the plurality of pin cooling structures are arranged in an offset matrix array.

A24. The heat transfer device of any of paragraphs A20-A21, wherein arrangement of the plurality of pin cooling structures on the first disc is based on one or more characteristics of the external/separate body.

A25. The heat transfer device of any of paragraphs A1-A24, wherein the pin cooling structure is electrically conductive, and is further configured to provide an electrical path between the external body and the heat transfer device.

A26. The heat transfer device of any of paragraphs A1-A25, wherein the heat transfer device further comprises an adapter configured to affix to an external/separate component.

A27. The heat transfer device of any of paragraphs A1-A21, wherein the first disc and the second disc are configured to deform responsive to a temperature change of the heat transfer device.

A28. The heat transfer device of paragraph A27, wherein the first disc and the second disc are configured such that deformation of the first disc and the second disc responsive to the temperature change of the heat transfer device comprises causing the pin cooling structure to be transformed as the temperature of the heat transfer device increases.

A29. The heat transfer device of any of paragraphs A27-A28, wherein the first disc and the second disc are configured such that the deformation of the first disc and the second disc responsive to the temperature change is characterized by one or more Zernike polynomials.

A30. The heat transfer device of any of paragraphs A27-A29, wherein the first disc and the second disc are configured such that the deformation of the first disc and the second disc causes the heat transfer device to achieve a target shape when the heat transfer device reaches a target temperature.

A31. The heat transfer device of any of paragraphs A27-A30, wherein at least one of the first disc and the second disc is composed of functionally gradient materials.

A32. The heat transfer device of paragraph A31, wherein the properties of the functionally gradient materials are configured to cause the heat transfer device to achieve a/the target shape when the heat transfer device reaches a/the target/threshold temperature.

A33. The heat transfer device of any of paragraphs A1-A32, wherein the pin cooling structure is perpendicular with a surface of the first disc.

A34. The heat transfer device of any of paragraphs A1-A33, wherein an angle between the pin cooling structure and a/the surface of the first disc is configured to create optimal contact with the external/separate body when the heat transfer device is deformed.

A35. The heat transfer device of any of paragraphs A1-A34, wherein the fluid comprises, and optionally is or consists of, methane.

A36. The heat transfer device of any of paragraphs A1-A35, further comprising a chimney through which the fluid is able to flow from the fluid channel to an exhaustion, diffusion, and/or effusion region, and wherein exhausting the fluid from the fluid channel comprises the fluid flowing through the chimney and to the exhaustion, diffusion, and/or effusion region.

A37. The heat transfer device of any of paragraphs A1-A36, further comprising at least one exit interface that enables the fluid to flow from the fluid channel to a/the exhaustion, diffusion, and/or effusion region, and wherein exhausting the fluid from the fluid channel comprises the fluid flowing through the at least one exit interface and to the exhaustion, diffusion, and/or effusion region.

A38. The heat transfer device of any of paragraphs A36-A37, wherein the exhaustion, diffusion, and/or effusion region is the environment of the heat transfer device.

A39. The heat transfer device of any of paragraphs A1-A38, wherein the external body is one of an electronic device and an electronic component.

A40. The heat transfer device of any of paragraphs A1 and A5-A39, wherein the first disc comprises:
a surface layer including the pin cooling structure; and
a rigid layer adjacent to the surface layer and disposed between the surface layer and the fluid channel wherein the rigid layer partially defines the fluid channel.

A41. The heat transfer device of paragraph A40 wherein the rigid layer is composed of a material having a lower modulus of elasticity and/or a higher coefficient of thermal expansion than the surface layer.

B1. A combination of the heat transfer device of any of paragraphs A1-A40 and an electronic device, wherein the electronic device comprises the external body.

B2. The combination of paragraph B1 when depending from paragraph A12, wherein an/the expansion of the micro-bellows causes the distal and distended end of the pin cooling structure to make contact with the external body.

B3. The combination of any of paragraphs B1-B2 when depending from paragraph A27, wherein a/the deformation of the first disc and the second disc causes the distal end of the pin cooling structure to make contact with the external/separate body.

C1. An electronic device, comprising: the heat transfer device of any of paragraphs A1-A40; and the external body.

D1. The use of the heat transfer device of any of paragraphs A1-A40 to cool an external body.

E1. The use of the heat transfer device of any of paragraphs A1-A40 to heat an external body.

F1. A method for conducting a heat exchange with an external body, comprising:
flowing a fluid from an inlet defined by a second disc of a heat transfer device and into an internal pin volume defined by a pin cooling structure, wherein the pin cooling structure is a component of a first disc of the heat transfer device, and wherein the first disc is adjacent to the second disc;
transferring heat between the external body and the fluid within the internal pin volume via the pin cooling structure; and
flowing the fluid from the internal pin volume to a fluid channel, wherein the fluid channel is defined by the second disc and the first disc.

F2. The method of paragraph F1, wherein transferring the heat flow between the external body and the fluid within the internal pin volume comprises:
receiving heat from the external body by the pin cooling structure; and
transferring the heat to flow from the pin cooling structure to the fluid within the internal pin volume.

F3. The method of any of paragraphs F1-F2, further comprising exhausting the fluid from the heat transfer device.

F4. The method of paragraph F3, wherein the exhausting the fluid further comprises exhausting the heat from the heat transfer device.

F5. The method of any of paragraphs F1-F4, further comprising translating a distal end of the pin cooling structure away from the first disc based on the fluid flowing into the internal pin volume.

F6. The method of paragraph F5, wherein the pin cooling structure comprises a micro-bellows, and wherein the translating the distal end of the pin cooling structure toward the external body corresponds at least in part to the micro-bellows expanding.

F7. The method of paragraph F5, further comprising deforming at least one of the second disc of the heat transfer device and the first disc of the heat transfer device based on a change in temperature of the heat transfer device, and wherein the translating the distal end of the pin cooling structure is based at least in part on the deforming.

F8. The method of any of paragraphs F1-F7, performed by the heat transfer device of any of paragraphs A1-A41.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function.

As used herein, the term "and/or" placed between a first entity and a second entity means one of (1) the first entity, (2) the second entity, and (3) the first entity and the second entity. Multiple entries listed with "and/or" should be construed in the same manner, i.e., "one or more" of the entities so conjoined. Other entities optionally may be present other than the entities specifically identified by the "and/or" clause, whether related or unrelated to those entities specifically identified. Thus, as a non-limiting example, a reference to "A and/or B," when used in conjunction with open-ended language such as "comprising," may refer, in one example, to A only, as well as reoccurring absence/presence of A only, (optionally including entities other than B); in another example, to B only, as well as reoccurring absence/presence of B only, (optionally including entities other than A); in yet another example, to both A and B, as well as reoccurring absence/presence of A and B, (optionally including other entities). These entities may refer to elements, actions, structures, steps, operations, values, and the like.

The various disclosed elements of apparatuses and steps of methods disclosed herein are not required to all apparatuses and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus or method. Accordingly, such inventive subject matter is not required to be associated with the specific apparatuses and methods that are expressly disclosed herein, and such inventive subject matter may find utility in apparatuses and/or methods that are not expressly conceived for this unique AM apparatus and method.

The invention claimed is:

1. A heat transfer device, comprising:
a first disc defining an aperture and comprising a pin cooling structure extending from around the aperture, the pin cooling structure comprising:

a distal end configured to facilitate heat exchange between the pin cooling structure and an external body; and one or more side walls, wherein at least one of the one or more side walls, the distal end, and the aperture at least partially define an internal pin volume;

a second disc positioned adjacent to the first disc and defining an inlet, wherein the inlet is configured to:
receive a fluid; and
allow the fluid to flow from the inlet and into the internal pin volume; and at least one spacer positioned between the first disc and the second disc;

wherein a fluid channel is defined between the first disc and the second disc, and wherein the fluid channel is in fluid communication with the internal pin volume;

wherein the first disc and the second disc are configured to deform responsive to a temperature change of the heat transfer device, and wherein a deformation of the first disc and the second disc responsive to the temperature change causes the pin cooling structure to be translated as a temperature of the heat transfer device changes; and wherein the first disc and the second disc are configured such that deformation of the first disc and the second disc causes the heat transfer device to achieve a target deformation pattern when the heat transfer device reaches a target temperature.

2. The heat transfer device of claim 1, wherein the first disc, the second disc, and the at least one spacer are formed of a single body.

3. The heat transfer device of claim 1, wherein the second disc further comprises an injector extending from the inlet and into the internal pin volume, and wherein the injector defines a pin channel configured to allow the fluid to flow from the inlet and into the internal pin volume.

4. The heat transfer device of claim 1, wherein the pin cooling structure further comprises a micro-bellows that is configured to expand in response to the fluid being injected into the internal pin volume of the pin cooling structure.

5. The heat transfer device of claim 4, wherein the micro-bellows is configured to deform in response to the distal end of the pin cooling structure making contact with the external body.

6. The heat transfer device of claim 1, further comprising a fluid reservoir configured to allow the fluid to flow into the inlet from the fluid reservoir, and wherein the heat transfer device is configured to allow the fluid to flow into the inlet from the fluid reservoir in response to a trigger event.

7. The heat transfer device of claim 6, wherein the trigger event corresponds to at least one of:
the heat transfer device reaching a threshold temperature;
the fluid reaching a trigger pressure; or
an external stimulus triggering a barrier element to open.

8. The heat transfer device of claim 1, wherein the first disc further defines a plurality of apertures and further comprises a plurality of corresponding pin cooling structures.

9. The heat transfer device of claim 8, wherein the second disc further comprises a plurality of inlets, wherein each inlet of the plurality of inlets is configured to allow the fluid to flow from each inlet and into a corresponding internal pin volume defined by a corresponding pin cooling structure of the plurality of pin cooling structures.

10. The heat transfer device of claim 1, wherein at least one of the first disc and the second disc are composed of functionally gradient materials, and wherein the functionally gradient materials are configured to cause the heat transfer device to achieve the target deformation pattern when the heat transfer device reaches the target temperature.

11. The heat transfer device of claim 1, further comprising at least one exit interface that enables the fluid to flow from the fluid channel to an effusion region.

12. The heat transfer device of claim 1, wherein the first disc comprises:
a surface layer including the pin cooling structure; and
a more rigid layer adjacent to the surface layer, more rigid than the surface layer, and disposed between the surface layer and the fluid channel, wherein the more rigid layer partially defines the fluid channel, and wherein the more rigid layer is composed of a material having at least one of a lower modulus of elasticity and a higher Coefficient of Thermal Expansion (CTE) than the surface layer.

13. A method for conducting a heat exchange with an external body using the heat transfer device of claim 1, the method comprising:
flowing the fluid from the inlet into the internal pin volume;
transferring heat between the external body and the fluid within the internal pin volume via the pin cooling structure; and
flowing the fluid from the internal pin volume to the fluid channel.

14. The method of claim 13, wherein transferring heat between the external body and the fluid within the internal pin volume comprises:
receiving heat from the external body by the pin cooling structure; and
transferring the heat to flow from the pin cooling structure to the fluid within the internal pin volume.

15. The method of claim 13, further comprising exhausting the fluid and the heat from the heat transfer device.

16. The method of claim 13, further comprising translating the distal end of the pin cooling structure away from the first disc based on the fluid flowing into the internal pin volume.

17. The method of claim 16, wherein the pin cooling structure comprises a micro-bellows, and wherein the translating the distal end of the pin cooling structure toward the external body corresponds at least in part to the micro-bellows expanding.

18. The method of claim 16, further comprising deforming at least one of the second disc of the heat transfer device and the first disc of the heat transfer device based on a change in temperature of the heat transfer device, and wherein the translating the distal end of the pin cooling structure is based at least in part on the deforming of one or more discs.

19. The heat transfer device of claim 1, wherein the first disc and the second disc are configured such that the deformation of the first disc and the second disc responsive to the temperature change is characterized by one or more Zernike polynomials.

20. A combination of the heat transfer device of claim 1 and an electronic device, wherein the deformation of the first disc and the second disc causes the distal end of the pin cooling structure to make contact with the electronic device.

* * * * *